(12) United States Patent
Sato

(10) Patent No.: US 10,134,570 B2
(45) Date of Patent: Nov. 20, 2018

(54) RADIOFREQUENCY ADJUSTMENT FOR INSTABILITY MANAGEMENT IN SEMICONDUCTOR PROCESSING

(71) Applicant: Lam Research Corporation, Fremont, CA (US)

(72) Inventor: Arthur Sato, San Jose, CA (US)

(73) Assignee: Lam Research Corporation, Fremont, CA (US)

(*) Notice: Subject to any disclaimer, the term of this patent is extended or adjusted under 35 U.S.C. 154(b) by 582 days.

(21) Appl. No.: 14/714,576

(22) Filed: May 18, 2015

(65) Prior Publication Data

US 2015/0248995 A1 Sep. 3, 2015

Related U.S. Application Data

(62) Division of application No. 13/793,735, filed on Mar. 11, 2013, now Pat. No. 9,059,101.

(51) Int. Cl.
*H01J 37/32* (2006.01)
*H01L 21/67* (2006.01)
(Continued)

(52) U.S. Cl.
CPC .. *H01J 37/32935* (2013.01); *H01J 37/32082* (2013.01); *H01J 37/3299* (2013.01); *H01J 37/32155* (2013.01); *H01J 37/32174* (2013.01); *H01J 37/32183* (2013.01); *H01J 37/32926* (2013.01); *H01L 21/3065* (2013.01);
(Continued)

(58) Field of Classification Search
CPC ........... H01J 37/32935; H01J 37/67253; H01J 37/67069; H01J 37/32155; H01J 37/32183; H01J 2237/334
See application file for complete search history.

(56) References Cited

U.S. PATENT DOCUMENTS

2004/0004708 A1* 1/2004 Willis ............... H01J 37/32082
356/72
2008/0014758 A1* 1/2008 Chou .................... C23C 16/345
438/761
(Continued)

FOREIGN PATENT DOCUMENTS

JP          2003013239 A * 1/2003

*Primary Examiner* — Yuechuan Yu
(74) *Attorney, Agent, or Firm* — Martine Penilla Group, LLP

(57) ABSTRACT

Methods, systems, and computer programs are presented for reducing chamber instability while processing a semiconductor substrate. One method includes an operation for identifying a first recipe with steps having an operating frequency equal to the nominal frequency of a radiofrequency (RF) power supply. Each step is analyzed with the nominal frequency, and the analysis determines if any step produces instability at the nominal frequency. The operating frequency is adjusted, for one or more of the steps, when the instability in the one or more steps exceeds a threshold. The adjustment acts to find an approximate minimum level of instability. A second recipe is constructed after the adjustment, such that at least one of the steps includes a respective operating frequency different from the nominal frequency. The second recipe is used to etch the one or more layers disposed over the substrate in the semiconductor processing chamber.

20 Claims, 8 Drawing Sheets

(51) Int. Cl.
*H01L 21/3065* (2006.01)
*H01L 21/66* (2006.01)
*H05B 41/292* (2006.01)

(52) U.S. Cl.
CPC .. *H01L 21/67069* (2013.01); *H01L 21/67253* (2013.01); *H01L 22/00* (2013.01); *H01L 22/20* (2013.01); *H01J 2237/334* (2013.01); *H01L 2924/0002* (2013.01); *H05B 41/2928* (2013.01)

(56) References Cited

U.S. PATENT DOCUMENTS

2010/0270141 A1* 10/2010 Carter ............... H01J 37/32935
 204/164
2013/0168354 A1* 7/2013 Kanarik ............ H01J 37/32082
 216/68

* cited by examiner

RADIOFREQUENCY ADJUSTMENT FOR INSTABILITY MANAGEMENT IN SEMICONDUCTOR PROCESSING

CLAIM OF PRIORITY

This application is a Divisional Application of U.S. patent application Ser. No. 13/793,735, filed on Mar. 11, 2013, and entitled, "RADIOFREQUENCY ADJUSTMENT FOR INSTABILITY MANAGEMENT IN SEMICONDUCTOR PROCESSING." The disclosure of this related application is incorporated herein by reference for all purposes.

CROSS REFERENCE TO RELATED APPLICATIONS

This application is related to U.S. patent application Ser. No. 13/177,620, filed Jul. 7, 2011, and entitled "Methods for Automatically Determining Capacitor Values and Systems Thereof," which is incorporated herein by reference.

BACKGROUND

1. Field of the Invention

The present embodiments relate to methods for improving semiconductor process uniformity, and more particularly, methods, systems, and computer programs for reducing chamber instability while processing a semiconductor substrate.

2. Description of the Related Art

Plasma has long been employed to process substrates (e.g., wafers or flat panels) to form electronic products (e.g., integrated circuits or flat panel displays). In plasma processing, a process gas may be injected into a chamber and energized to form a plasma to either deposit a layer on the substrate or to sputter or etch the substrate. In some processes, particularly those involving deep etching of the silicon layer, there exist various etch techniques that alternate etching and deposition sub-steps in order to perform the etch more anisotropically (e.g., forming sidewalls of the trenches or holes more vertically).

However, sometimes chamber conditions do not stay unchanged over time. Undesired phenomena, such as chamber drift (e.g., a situation in which the chamber conditions change from substrate to substrate due to, for example, polymer deposition), may render the values of the parameters in the chamber, that are found to be optimally for the first substrate, non-optimal for subsequent substrates. Accordingly, the etch result for the substrates may not be uniform, thereby impacting the repeatability of the etch process and affecting the quality of the end product.

It is in this context that embodiments arise.

SUMMARY

Methods, systems, and computer programs are presented for reducing chamber instability while processing a semiconductor substrate. It should be appreciated that the present embodiments can be implemented in numerous ways, such as a method, an apparatus, a system, a device, or a computer program on a computer readable medium. Several embodiments are described below.

In one embodiment, a method includes an operation for identifying a first recipe with steps having an operating frequency equal to the nominal frequency of a radiofrequency (RF) power supply. Each step is analyzed with the nominal frequency, and the analysis determines if any step produces instability at the nominal frequency. The operating frequency is adjusted, for one or more of the steps, when the instability in the one or more steps exceeds a threshold. The adjustment acts to find an approximate minimum level of instability. A second recipe is constructed after the adjustment, such that at least one of the steps includes a respective operating frequency different from the nominal frequency. The second recipe is used to etch the one or more layers disposed over the substrate in the semiconductor processing chamber.

In another embodiment, a method for processing a substrate in a semiconductor processing chamber is provided. The method includes an operation for identifying a first recipe having a plurality of steps that include an operating frequency equal to a nominal frequency for a radiofrequency (RF) power supply. The method further includes an operation for identifying a first step that shows instability while operating at the nominal frequency, and another operation for selecting a second frequency within a range of frequencies centered at the nominal frequency. The second frequency has a lower level of instability while performing the first step. In addition, the operating frequency for the first step is changed to be equal to the second frequency, resulting in a second recipe, where the second recipe is used to etch one or more layers disposed over the substrate in the semiconductor processing chamber.

In yet another embodiment, a system for processing a substrate includes a chamber, an RF power supply for providing RF power to the chamber, and a system controller. The RF power supply is defined to operate in one operating frequency from a plurality of different oscillating frequencies. Further, the system controller is coupled to the chamber and to the RF generator, where the system controller is operable to set a first recipe having a plurality of steps that define the operating frequency for the RF generator equal to a nominal frequency. The first recipe is used to etch one or more layers of material disposed over a substrate in the chamber. The system controller is further operable to analyze each step with the operating frequency equal to the nominal frequency, the analysis determining if any step produces instability at the nominal frequency. The system controller is further operable to adjust the operating frequency for one or more of the steps when the instability in the one or more steps exceeds a threshold, the adjusting acting to find an approximate minimum level of instability. Further, the system controller is operable to construct a second recipe after the adjusting such that at least one of the steps includes a respective operating frequency different from the nominal frequency, the second recipe being used to etch the one or more layers disposed over the substrate in the chamber.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe a method and apparatus for reducing chamber instability while processing a semiconductor substrate. It will be apparent, that the present embodiments may be practiced without some or all of these specific details. In other instances, well known process operations have not been described in detail in order not to unnecessarily obscure the present embodiments.

Figure 1:
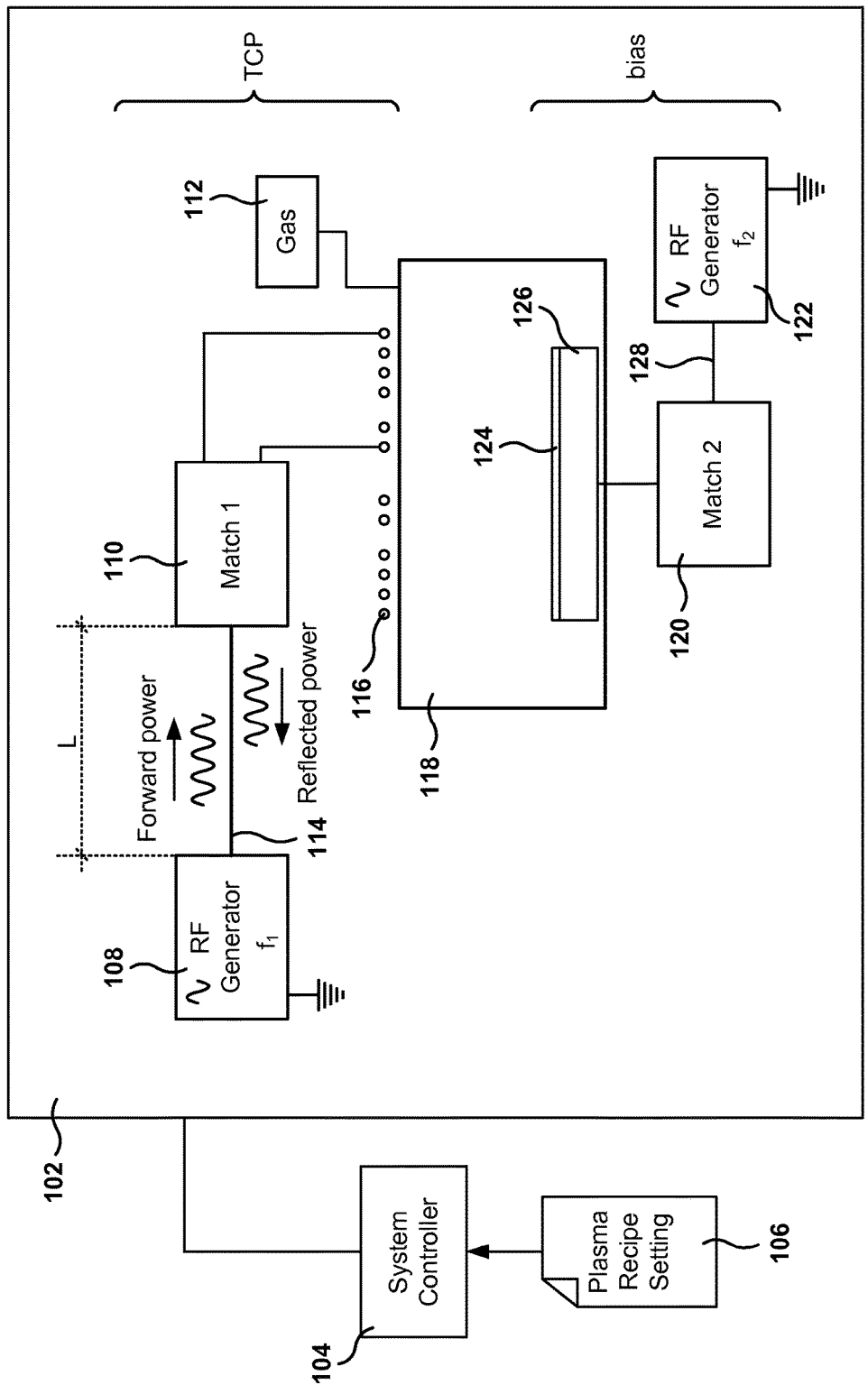
FIG. 1 is a diagram of a plasma apparatus for processing a substrate, in accordance with one embodiment of the invention.

FIG. 1 is a diagram of a plasma apparatus for processing a substrate, in accordance with one embodiment of the invention. The processing apparatus 102 includes a processing chamber 118. In one embodiment, the processing chamber 118 includes a top radiofrequency (RF) generator 108 operating at a first frequency $f_1$, and a bottom RF generator 122 operating at a second frequency $f_2$. Other embodiments may include one RF generator or more than two RF generators. The top RF generator 108 provides RF power to antenna 116 via a match network 110 and a TCP coaxial cable 114. The purpose of match network 110 is to minimize the reflected power and to maximize the forward power delivery from top RF generator 108 to antenna 116.

During processing, a substrate 124 is disposed on top of electrostatic chuck 126. In one embodiment, electrostatic chuck 126 is biased with the bottom RF power generator 122, which provides bias RF energy to electrostatic chuck 126 through a bias match network 120 and a bias RF power coaxial cable 128.

In one embodiment, top RF generator 108 operates in either a fixed-frequency mode (such as 13.56 Megahertz or some other suitable RF frequency) or in a frequency tuning mode (variable frequency mode) whereby different RF frequencies are provided in order to perform the power matching function. When top RF generator 108 operates in frequency tuning mode, one or more power sensors may detect the delivered and reflected powers and may attempt to minimize the reflected power to maximize power delivered to the plasma in the chamber. Frequency tuning requires setting the frequency oscillator at a desired frequency, although the actual delivered frequency may vary slightly from the desired frequency to optimize the power delivered to the load.

The purpose of frequency tuning is to minimize the reflected power from the plasma. Sometimes this process is referred to as a Bosch process, which uses a mixture of $SF_6$ and $C_4F_8$, although other types of gases are also possible. In one embodiment, the ratio between the two gases is switched from phase to phase. Bosch process works by performing a small amount of etching and then depositing a small amount.

In one embodiment, the chamber gets filled and emptied repeatedly. This makes etching uniformity difficult because when gases are switched, there can be different mixtures in the chamber. One phase may last 150-200 ms, but other values are also possible. In some embodiments, there are four phases, and sometimes there may be additional phases to facilitate transitions between operations.

A gas delivery system 112 may include one or more gas sources such as gas cylinders, associated manifolds, valves and the like. Gas delivery system 112 is employed to provide the process source gas (such as source etchant and/or deposition gas) to the interior volume of chamber 118 via a port and a showerhead arrangement. During processing, the process source gas is ignited by top RF generator 108 and/or bias bottom RF generator 122 into a plasma inside chamber 118 for processing substrate 124.

In one embodiment, the substrate is processed utilizing a Rapid Alternating Process (RAP), which alternates etching and deposition cycles during etching. During processing, the chamber runs what is called a Bosch process, where periodically (e.g., every second, or second and a half, although other values are also possible) gasses and the TCP process change. This is a difficult situation for the power system to handle. In the RAP process, different process parameters are utilized for the alternating deposition and etching cycles. These process parameters may include, for example, different chemistries, pressures, bias voltages, TCP (inductive coil) voltages, and the like. The alternating cycles are typically executed such that a deposition cycle is followed by an etch cycle, and then a deposition cycle, and so on.

In one embodiment, match network 110 includes tunable capacitors whose capacitor values may be changed to accomplish power matching. This mode of operation is referred to herein as the capacitor tuning mode.

In yet another embodiment, the RF power supply is defined to operate in one operating frequency from a plurality of different oscillating frequencies. Further, a system controller 104 is coupled to the chamber 118 and to the RF generator 108, where the system controller 104 is operable to identify a first recipe 106 having a plurality of steps that define the operating frequency for the RF generator equal to a nominal frequency. The first recipe 106 is used to etch one or more layers of material disposed over a substrate 124 in the chamber. The system controller 104 is further operable to analyze each step with the operating frequency equal to the nominal frequency, the analysis determining if any step produces instability at the nominal frequency. The system controller is further operable to adjust the operating frequency for one or more of the steps when the instability in the one or more steps exceeds a threshold, the adjusting acting to find an approximate minimum level of instability. Further, the system controller 104 is operable to construct a second recipe after the adjusting such that at least one of the steps includes a respective operating frequency different from the nominal frequency, the second recipe being used to etch the one or more layers disposed over the substrate in the chamber. In one embodiment, the system controller 104 receives the first recipe 106 in a non-transitory computer readable medium.

Embodiments presented below are described with reference to a TCP chamber, but other embodiments may utilize different types of chambers. Although an inductively coupled chamber is employed to facilitate discussion in the specification, the embodiments also apply to other types of plasma chambers such as capacitively coupled chambers (single or multiple RF frequencies), microwave, ECR, etc. Although various examples are provided herein, it is intended that these examples be illustrative and not limiting with respect to the embodiments of the invention.

Figure 2:
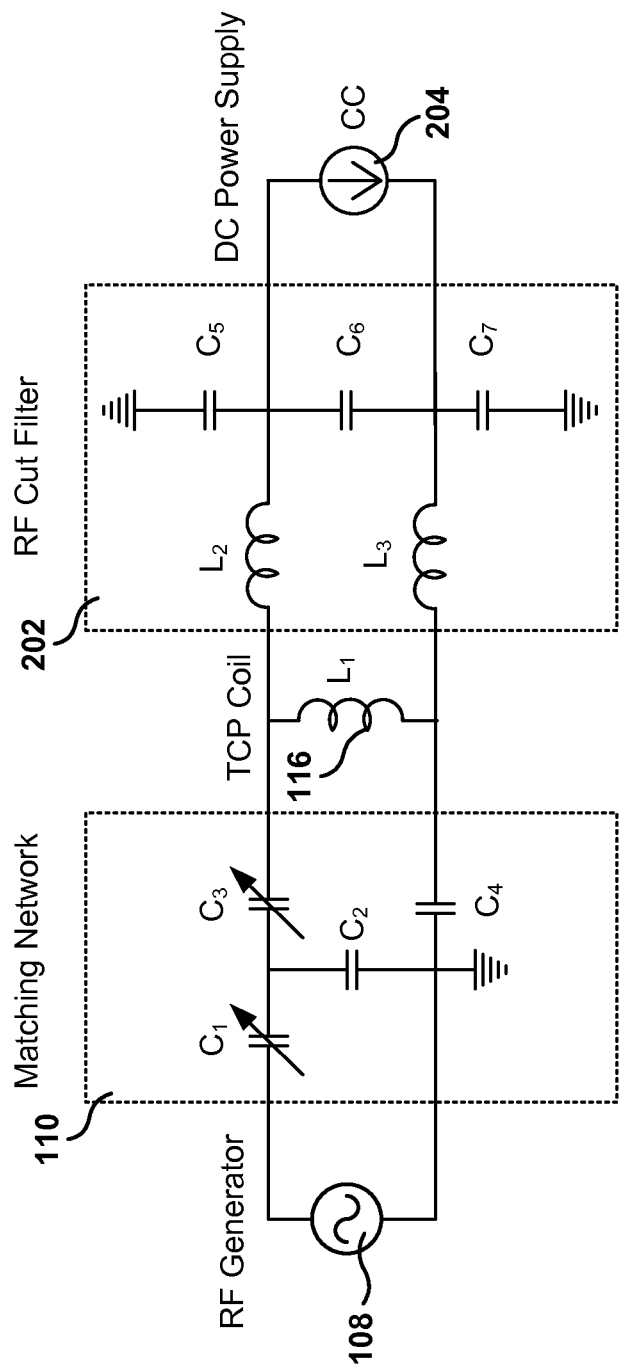
FIG. 2 is an electric circuit for supplying radiofrequency (RF) power and direct current to an RF induction coil, in accordance with one embodiment of the invention.

FIG. 2 is an electric circuit for supplying radiofrequency (RF) power and direct current to an RF induction coil, in accordance with one embodiment of the invention. In one embodiment, an RF Filter 202 is also included to provide direct current (DC) power to the antenna 116, also referred to as TCP coil 116. In one embodiment, the RF generator 108 of FIG. 1 supplies an RF current to the TCP coil 116 via a matching network 110. Moreover, a DC power supply 204 simultaneously supplies a direct current to the RF induction coil 116 via an RF cut filter 202 separated from the DC power supply 204.

In one embodiment, the matching network 110 includes fixed capacitors $C_2$, $C_4$ and variable capacitors $C_1$ and $C_3$. The RF Filter 202 includes coils $L_2$, $L_3$ and a plurality of capacitors $C_5$, $C_6$, and $C_7$. In frequency tuning, the capacitors in the mechanical RF match network are fixed at some values and the RF power supply varies the frequencies of the RF signals in order to match the power delivered to the load. Since the power delivered typically involves at least two components (e.g., real and imaginary), two tunable capacitors are typically employed, but other number of tunable capacitors and inductances may be utilized in other embodiments.

Figure 3:
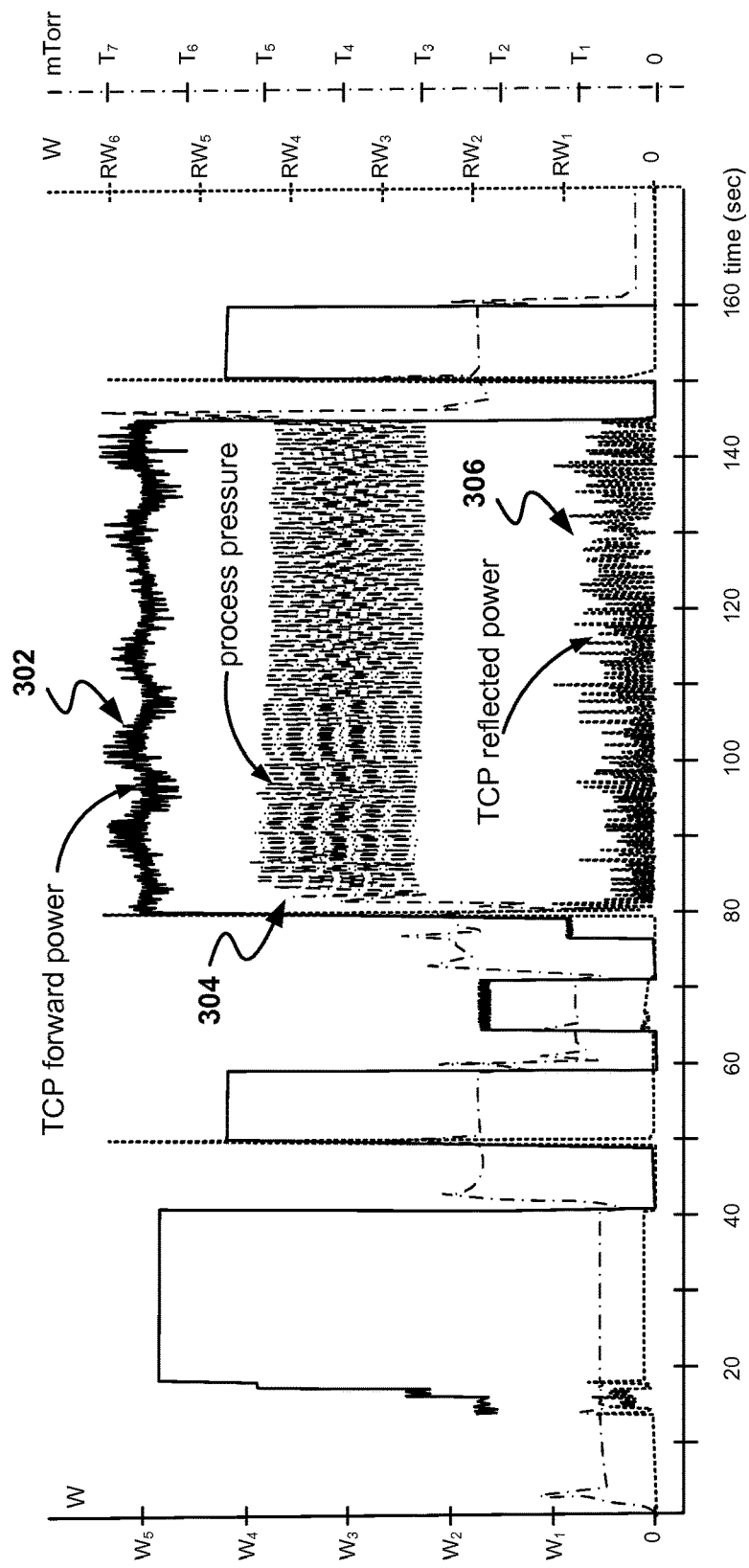
FIG. 3 is a diagram showing instability measurements in a processing chamber, according to one embodiment.

FIG. 3 is a diagram showing instability measurements in a processing chamber, according to one embodiment. In one embodiment, there is a power sensor at the output of the generator. The power sensor is directional and splits the power in the form of a "forward wave" (going forward) and a "reflected wave" (or reflected power) going backward towards the generator.

Sometimes, the settings in the chamber may cause instability due to the interactions between the TCP coil, the matching system, and the generator. A symptom of instability is having reflected power high and uncontrollable. Sometimes, there is a positive feedback in the system control loop from the generator to the plasma, which may drive the system unstable. The problem may be caused by the phasing of the reflected power back to the RF generator that causes positive feedback.

One way to solve the problem is by changing the length L of the cable 114 of FIG. 1 which couples the RF generator to the match. In one embodiment, the phase shift in the cable is proportional to the ratio L/λ, where λ is the wavelength of the RF signal. In a 13.56 MHz signal, λ=48.4 feet, approximately, in polyethylene dielectric coaxial cable. λ is calculated according to the following formula:

$$\lambda = v_{ph} \cdot f \qquad (1)$$

Where $v_{ph}$ is the phase speed in the cable and f is the frequency. By changing the length of the cable L, it is possible to control the phase shift of the RF power signal. Through experimentation, it is possible to select a cable length that works for many steps, or most steps, during the processing of the substrate. The engineer may change the length of the cable and then measure the reflective power. Often, there is a region where the reflective power dips. This way the length of the cable may be adjusted to optimize the reflective power. However, there may be some steps where the length of the cable does not solve instability problems due to high reflected power.

FIG. 3 illustrates some measurements taken in the processing chamber for a particular recipe step. Three different measurements are presented, the TCP forward power 302, the process pressure 304 in the chamber, and the TCP reflected power 306. The scale for the TCP forward power 302 is on the left side, and the scales for the TCP reflected power 306 and the process pressure 304 are on the right side.

In this particular measurement, there is instability in the period between about 80 and 150 seconds. The instability may be observed in the oscillatory behavior of the TCP forward power. Typically, during a RAP step (where the pressure is deliberately being changed in a periodic way), this can be controlled to +/−3% excursions, or smaller. In an unstable case, as is shown, the oscillations exceed +/−10%. The oscillation is actually continuously occurring during the RAP step at a very high frequency, but because of the limited sampling rate of the system data logger, aliasing occurs, and it only appears that the instability has a slow beat-like period of about 10 seconds. As a result of the instability, the process is out of control, resulting in the degradation of the profile being etched.

Figure 4:
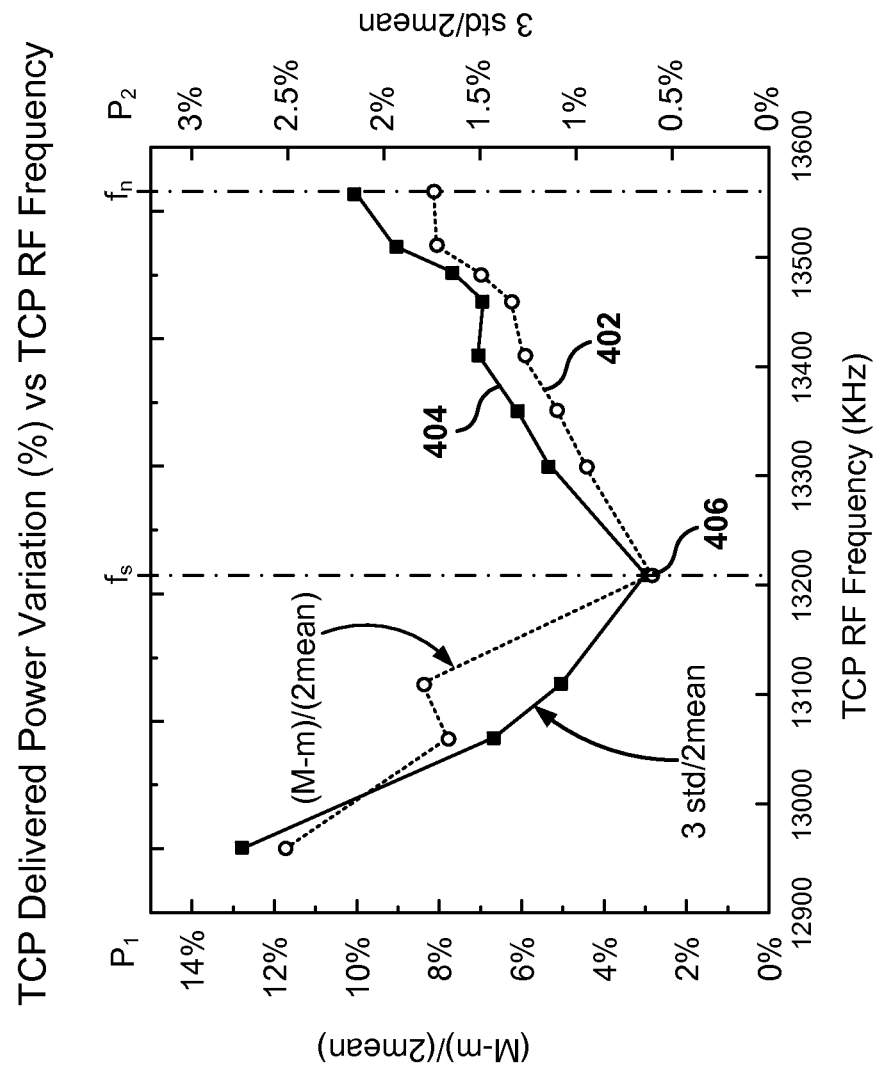
FIG. 4 is a diagram showing instability measurements obtained while processing a substrate at different RF frequencies, according to one embodiment.

FIG. 4 is a diagram showing instability measurements obtained while processing a substrate at different RF frequencies, according to one embodiment. A plasma recipe, or simply called a recipe, includes instructions for the different operations (also referred to as steps) to be performed on the chamber for processing a wafer. Processing of the wafer may be done in multiple steps, and each step may require different settings in the chamber. For example, recipe steps may differ in power levels, gas mixtures, chamber pressure, etc.

After selecting a cable length for the chamber, the selected cable length may be appropriate for the vast majority of recipe steps, but it may cause instability in certain steps. After setting the cable length, something different must be done if the step produces instability at the initially intended operating frequency. It is desirable to change the phase shift in the cable in order to avoid, or at least reduce, instability. As used herein, the nominal frequency $f_n$, also referred to as standard frequency, is a frequency that has been defined as the operating frequency for processing a plurality of recipe steps. In one embodiment, the nominal frequency $f_n$ is 13.56 MHz, but other nominal frequencies are also possible. However, if a step becomes unstable when using the nominal frequency $f_n$, then embodiments presented herein change the operating frequency for the step to be different from the nominal frequency $f_n$. The new operating frequency is referred to herein as frequency shifted $f_s$, new operating frequency, or simply operating frequency $f_s$.

In one embodiment, in order to determine the best new operating frequency $f_s$, the performance of the chamber for a range of frequencies around the nominal frequency $f_n$ is measured. In one embodiment, the range of frequencies is centered at the nominal frequency. For example, the range of frequencies includes frequencies between, the nominal frequency minus 5 percent, and the nominal frequency plus 5 percent. In another embodiment, the range of frequencies includes frequencies between, the nominal frequency minus 10 percent, and the nominal frequency plus 10 percent. In other implementations, the range of frequencies is not centered around $f_n$. In some embodiments, the range of frequencies includes frequencies that are 5% below $f_n$, or 10% below $f_n$, or 5% above $f_n$, or a range may have 5% of frequencies above $f_n$ and 10% of frequencies below, etc. In general any range of frequencies are also possible, as probabilistic methods may be developed over time to identify which ranges are more likely to produce stable operating steps.

FIG. 4 shows a chart describing a plurality of measurements taken at different operating frequencies. FIG. 4 shows measurements that include frequencies below the nominal frequency $f_n$, as the measurements taken above $f_n$ did not show stability improvements in this particular case.

The chart shows two different instability performance metrics $P_1$ and $P_2$, defined as follows:

$$P_1 = \frac{(\text{Maximum}(TCPP) - \text{Minimum}(TCPP))}{2\text{Mean}(TCPP)} \quad (2)$$

$$P_2 = \frac{3\text{StandardDeviation}(TCPP)}{2\text{Mean}(TCPP)} \quad (3)$$

Where TCPP is the TCP Delivered Power, Maximum (TCPP) is the maximum TCPP over a period of time showing instability, Minimum(TCPP) is the minimum TCPP over the same period of time, Mean(TCPP) is the mean of TCPP, and StandardDeviation(TCPP) is the Standard Deviation of TCPP.

It is noted that the embodiments illustrated in FIG. 4 are exemplary. Other embodiments may utilize different performance metrics, such as measuring the TCP reflected power, measuring the reflection coefficient, etc. The embodiments illustrated in FIG. 4 should therefore not be interpreted to be exclusive or limiting, but rather exemplary or illustrative.

The horizontal axis is the frequency f in KHz, the left vertical axis is for $P_1$, and the right vertical axis is for $P_2$. The values of $P_1$ are plotted on curve 402 and the values of $P_2$ are plotted on curve 404. $P_1$ measures how much TCPP oscillates from maximum to minimum power, normalized by dividing the difference by two times the mean of TCPP. $P_2$ is based on the standard deviation, also normalized.

At the nominal frequency $f_n$, $P_1$ is about 8% and $P_2$ is about 2.2%. As the frequency is lowered starting at $f_n$ (i.e., moving to lower frequencies starting at $f_n$), $P_1$ and $P_2$ improve initially, and then they become worse for frequencies below $f_s$. In this particular chemistry, the best frequency $f_s$ in the measured range is around 13.2 MHz. Therefore, the recipe is changed for this step and the frequency of the oscillator is set to 13.2 MHz. After this step, the frequency is reset back to the nominal frequency of 13.56 MHz (of course, unless the next step is also unstable, which may require a different frequency).

In one embodiment, a threshold for the instability is predetermined to identify which steps require a frequency adjustment. In other words, those steps whose instability does not exceed the threshold will operate at $f_n$, while other steps which exceed the threshold will operate at a different frequency $f_s$, if available, where the instability is less than at $f_n$. In one embodiment, the threshold is about 3% when using performance metric $P_1$. Other embodiments may utilize other thresholds, such as 1%, 2%, 5%, etc., or utilize other instability performance metrics (e.g., $P_2$) for defining the threshold.

Figure 5:
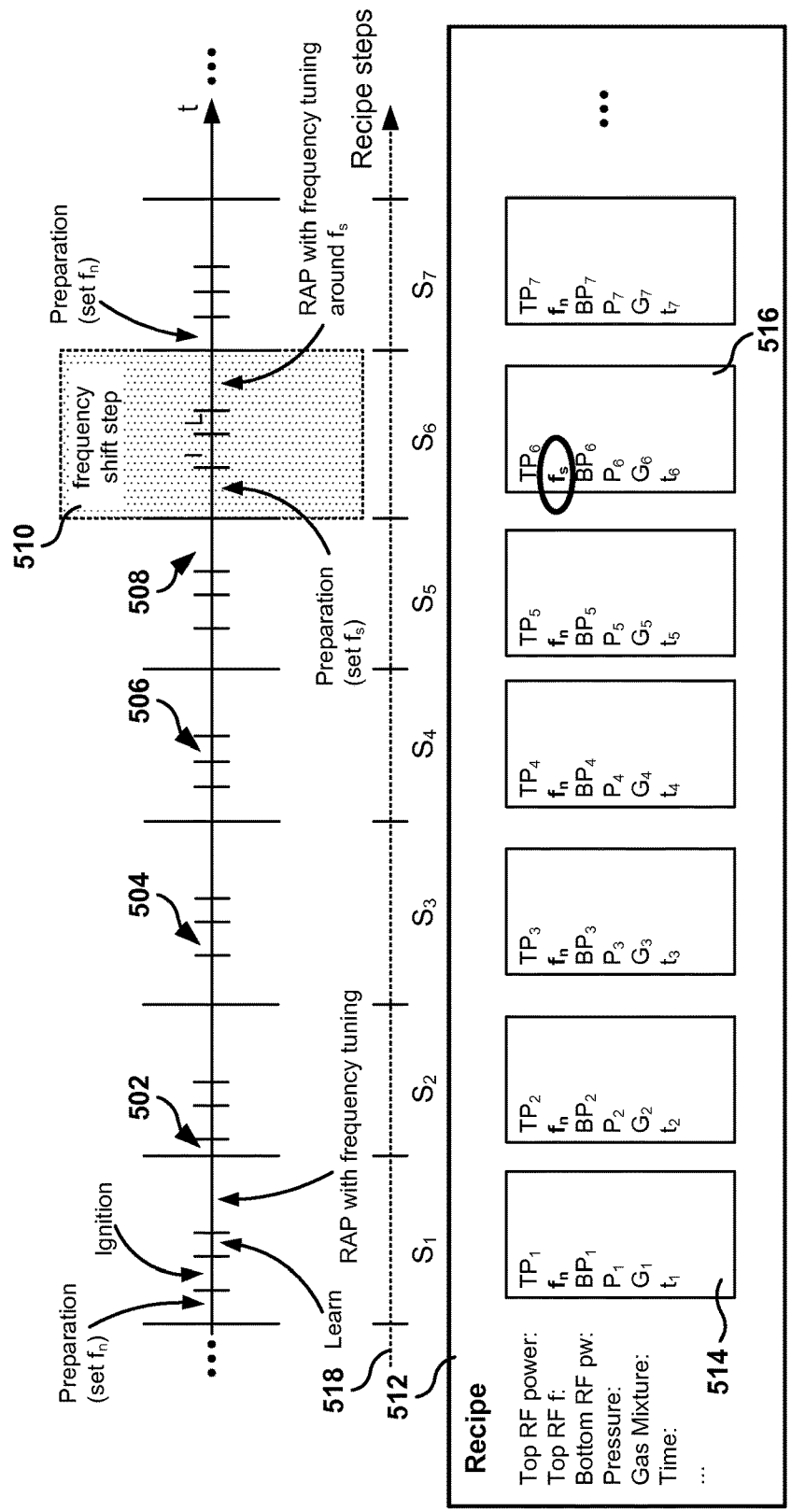
FIG. 5 illustrates the recipe steps utilized when processing a substrate, according to one embodiment.

FIG. 5 illustrates the recipe steps utilized when processing a substrate, according to one embodiment. As described above, a recipe 512 for processing a substrate includes 2 or more steps. FIG. 5 illustrates the first 7 steps 518 $S_1$-$S_7$ of a recipe. In one embodiment, each recipe step includes 4 different phases: Preparation 502, Learning 504, Ignition 506, and RAP 508. Other embodiments may utilize a different number of phases and the phases may vary from step to step.

In the Preparation phase, the parameters for operating the chamber are set. The parameters 514 may include one or more of the number of cycles for each phase, a number of cycles ignored before or after each phase, the top RF power, the top RF frequency, the bottom RF power, the bottom RF frequency, the pressure in the chamber, a gas mixture, a duration for each phase, etc. In the Ignition phase, following the Preparation phase, the plasma is ignited in the chamber.

In the Learning phase, the mechanical RF match is set up to operate in the mechanical tuning mode, while the RF generator is operated at the nominal frequency $f_n$ (e.g., at 13.56 Megahertz or another suitable frequency), or at a different frequency $f_s$ for some steps. The Learning phase lasts for the number of cycles defined in the recipe. In one embodiment, the capacitor positions or capacitor values are averaged over all the learning cycles, and the calculated average capacitor position(s) or value(s) are then loaded as preset values for the tunable capacitor(s) of the mechanical RF match network. In the RAP phase, the RF power is changed to operate in frequency tuning mode (after the capacitor values are set in the matching network).

Step $S_6$ 510 is a step in recipe 512 that utilizes a frequency shift, due to the instability detected in step $S_6$ at the nominal frequency $f_n$. The recipe 516 for step $S_6$ includes a setting with frequency fs, as well as other related parameters, such as top power $TP_6$, bottom power $BP_6$, pressure $P_6$, etc.

In order to implement the change in frequency, the system includes a feature that enables changing the frequency of the oscillator for a particular recipe step. In one embodiment, the system controller includes a command for fixing the frequency of the recipe step. When a step is unstable, a frequency $f_s$ with better stability is determined, and then this $f_s$ frequency is changed for this step. For example, in the embodiment of FIG. 4 a frequency $f_s$ of 13.21 MHz is utilized.

In one embodiment, since the new frequency $f_s$ is set for step $S_6$, the Ignition phase 104 for $S_6$ will use the $f_s$ frequency. Also, in the RAP phase, frequency tuning will be performed around the $f_s$ frequency.

It is noted that the embodiments illustrated in FIG. 5 are exemplary. Other embodiments may utilize different number of steps in a recipe, different phases in a step, different parameters for the recipe, etc. The embodiments illustrated in FIG. 5 should therefore not be interpreted to be exclusive or limiting, but rather exemplary or illustrative.

Figure 6:
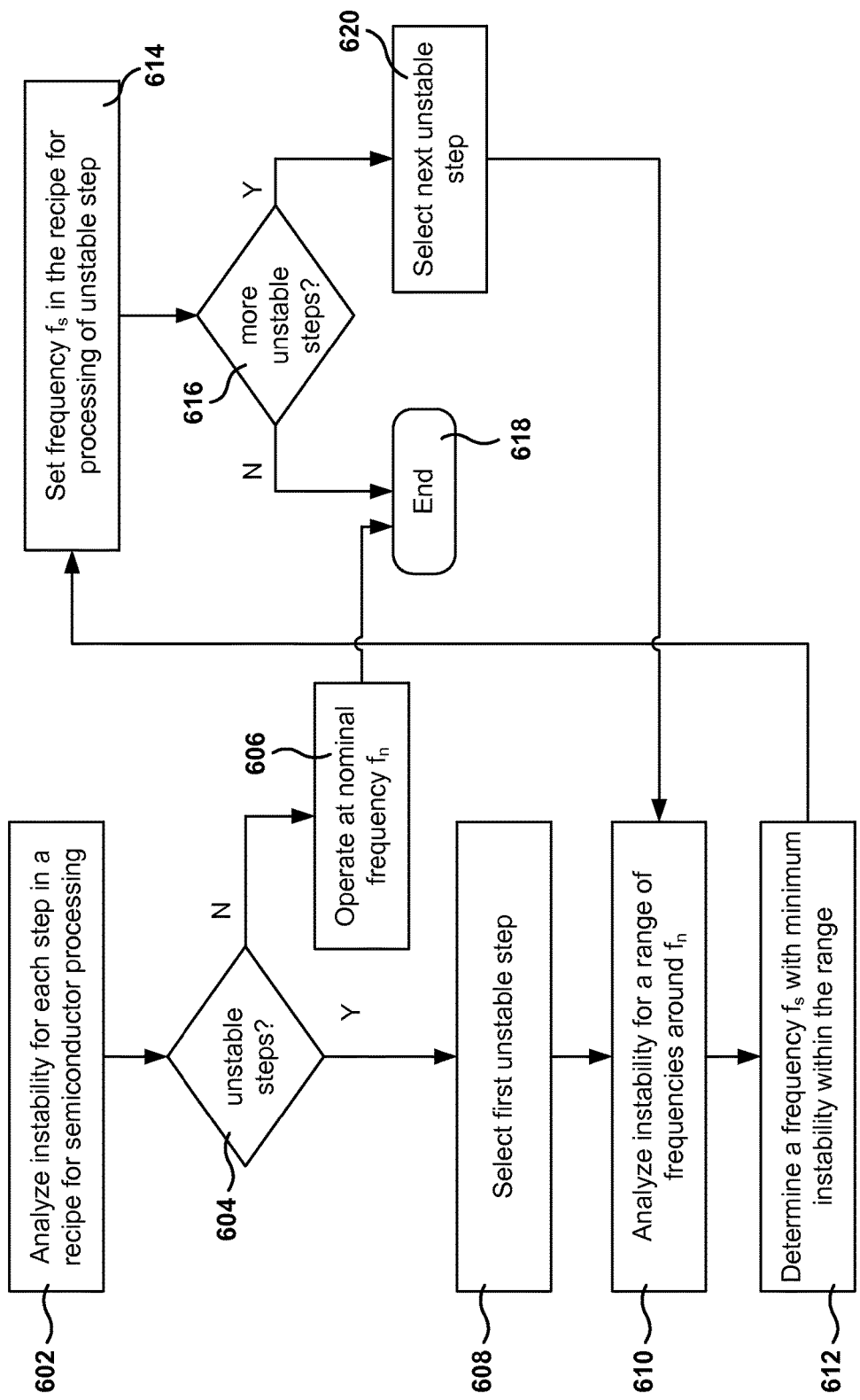
FIG. 6 is a flow chart determining the RF operating frequency, according to one embodiment.

FIG. 6 is a flow chart determining the RF operating frequency, according to one embodiment. In operation 602, the instability for each step in a recipe is measured. From operation 602, the method flows to operation 604 where a check is made to determine if there are any unstable steps. If there are not any unstable steps, the method flows to operation 606, and if there is at least one unstable step the method flows to operation 608.

In operation 606, the system recipe for the analyzed step is set to operate at the nominal frequency $f_n$, and then the method terminates 618. In operation 608, a first unstable step is selected for performing the process to determine a new operating frequency, if available, for this step.

From operation 608 the method flows to operation 610, where the instability is analyzed for a range of frequencies around the nominal frequency $f_n$ (e.g., the measurements take with reference to a particular step shown in FIG. 4). From operation 610 the method flows to operation 612, where a new operating frequency $f_s$ is determined from within the range of frequencies analyzed (e.g., frequency $f_s$ identified as having the lowest instability 406 in FIG. 4).

From operation 612, the method flows to operation 614 where the determined frequency $f_s$ is set in the recipe step for the step that is unstable at $f_n$. After operation 614, a check is made in operation 616 to determine if there are any more unstable steps. If there are not any more unstable steps the method ends 618, and if there are more unstable steps the next unstable step is selected in operation 620. From operation 620, the method flows back to operation 610 to determine the new $f_s$ for the unstable step.

Figure 7:
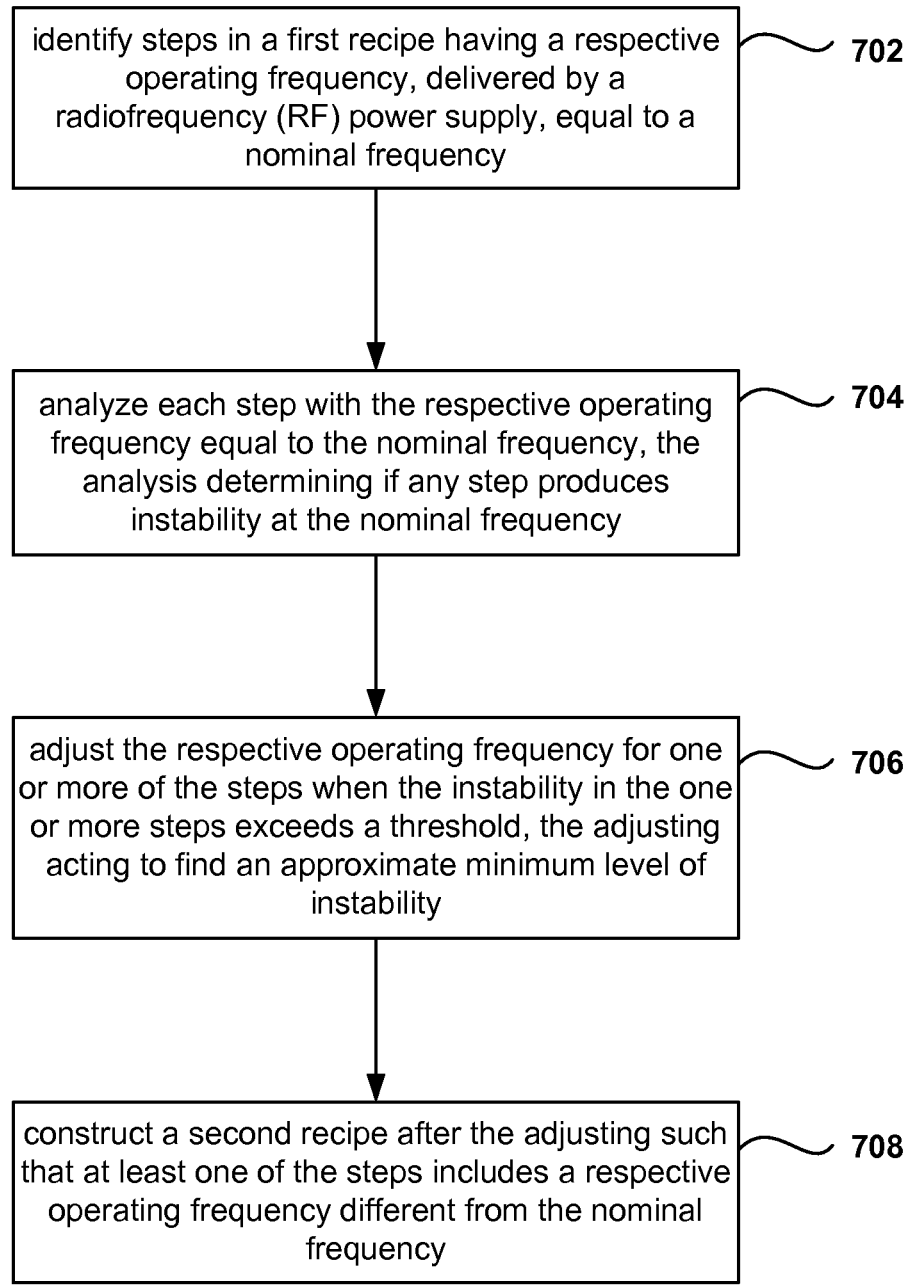
FIG. 7 is a flow chart for processing a substrate in a semiconductor processing chamber, according to one embodiment.

FIG. 7 is a flow chart for processing a substrate in a semiconductor processing chamber, according to one embodiment. In operation 702, the method identifies a first recipe with steps having an operating frequency equal to the nominal frequency of a radiofrequency (RF) power supply.

From operation 702 the method flows to operation 704, where each step is analyzed with the nominal frequency $f_n$, and the analysis determines if any step produces instability at the nominal frequency. In operation 706, the operating frequency is adjusted, for one or more of the steps, when the instability in the one or more steps exceeds a threshold. The adjustment acts to find an approximate minimum level of instability.

From operation 706 the method flows to operation 708, where a second recipe is constructed after the adjustment, such that at least one of the steps includes a respective operating frequency different from the nominal frequency. The second recipe is used to etch the one or more layers disposed over the substrate in the semiconductor processing chamber.

Figure 8:
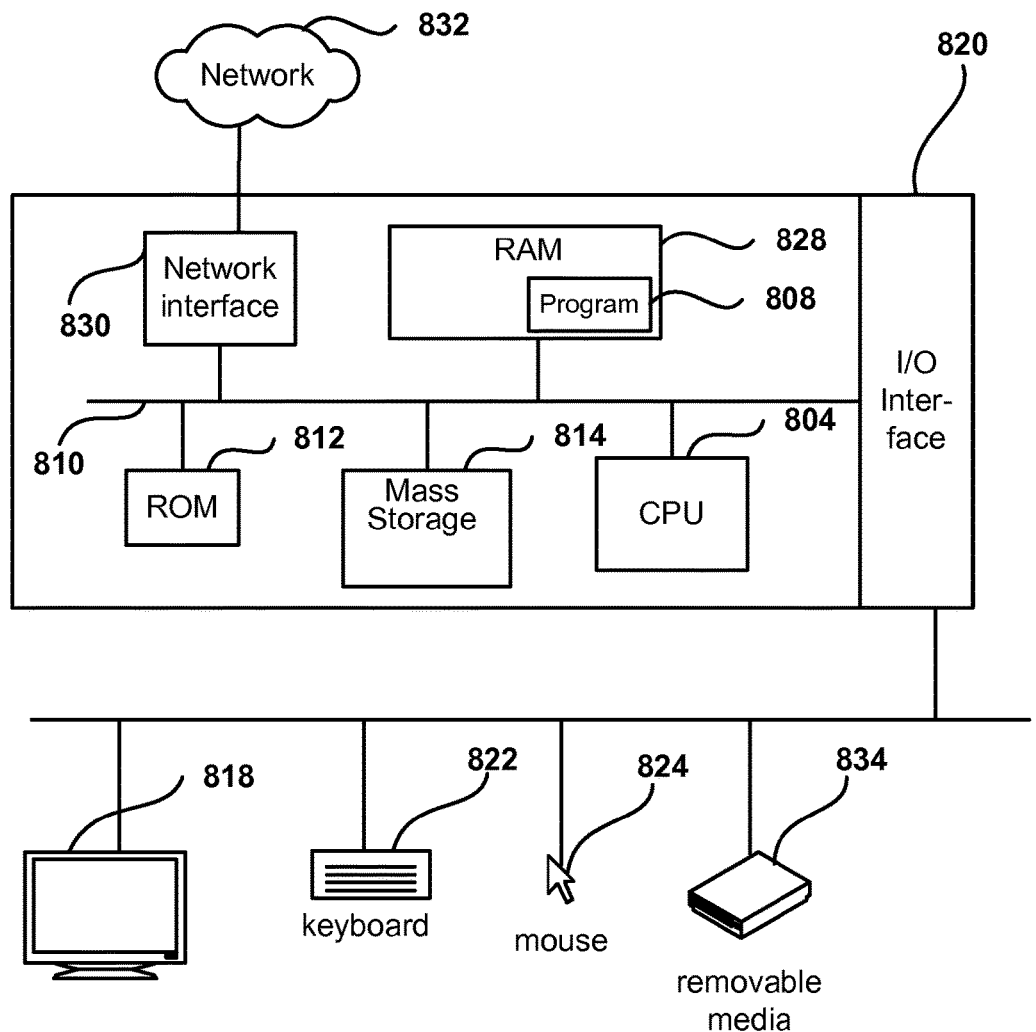
FIG. 8 is a simplified schematic diagram of a computer system for implementing embodiments of the present invention.

FIG. 8 is a simplified schematic diagram of a computer system for implementing embodiments of the present invention. It should be appreciated that the methods described herein may be performed with a digital processing system, such as a conventional, general-purpose computer system. Special purpose computers, which are designed or programmed to perform only one function may be used in the alternative. The computer system includes a central processing unit (CPU) 804, which is coupled through bus 810 to random access memory (RAM) 828, read-only memory (ROM) 812, and mass storage device 814. System controller program 808 resides in random access memory (RAM) 806, but can also reside in mass storage 814.

Mass storage device 814 represents a persistent data storage device such as a floppy disc drive or a fixed disc drive, which may be local or remote. Network interface 830 provides connections via network 832, allowing communications with other devices. It should be appreciated that CPU 804 may be embodied in a general-purpose processor, a special purpose processor, or a specially programmed logic device. Input/Output (I/O) interface provides communication with different peripherals and is connected with CPU 804, RAM 806, ROM 812, and mass storage device 814, through bus 810. Sample peripherals include display 818, keyboard 822, cursor control 824, removable media device 834, etc.

Display 818 is configured to display the user interfaces described herein. Keyboard 822, cursor control 824, removable media device 834, and other peripherals are coupled to I/O interface 820 in order to communicate information in command selections to CPU 804. It should be appreciated that data to and from external devices may be communicated through I/O interface 820. The invention can also be practiced in distributed computing environments where tasks are performed by remote processing devices that are linked through a wire-based or wireless network.

Embodiments of the present invention may be practiced with various computer system configurations including hand-held devices, microprocessor systems, microprocessor-based or programmable consumer electronics, minicomputers, mainframe computers and the like. The invention can also be practiced in distributed computing environments where tasks are performed by remote processing devices that are linked through a network.

With the above embodiments in mind, it should be understood that the invention can employ various computer-implemented operations involving data stored in computer systems. These operations are those requiring physical manipulation of physical quantities. Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments of the present invention can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A system for processing a substrate, the system comprising:
   a chamber;
   an RF power supply for providing RF power to the chamber, the RF power supply being defined to operate in one operating frequency from a plurality of different oscillating frequencies; and
   a system controller coupled to the chamber and the RF power supply, wherein the system controller is configured to set a first recipe having a plurality of steps using the operating frequency for the RF power supply equal to a nominal frequency, the first recipe being used to etch one or more layers of material disposed over a substrate in the chamber;
   wherein the system controller is further configured to analyze each step with the operating frequency equal to the nominal frequency, the analysis determining if any step produces instability at the nominal frequency, and adjust the operating frequency for one or more of the steps when the instability in the one or more steps exceeds a threshold, the adjusting acting to find an approximate minimum level of instability by operating the chamber at a plurality of testing frequencies within a range of frequencies and obtaining a measurement of said instability for each testing frequency;

wherein the system controller executes a second recipe having a plurality of steps instead of the first recipe for etching one or more layers of material disposed over the substrate in the chamber, the second recipe causing the system controller to adjust the operating frequency such that at least one step of the second recipe uses an adjusted frequency that is different from the nominal frequency while other steps of the second recipe use the nominal frequency, the system controller is configured to control an oscillator of the RF power supply to set the nominal frequency and the adjusted frequency during said etching.

2. The system as recited in claim 1, wherein the system controller is further configured to receive the first recipe in a non-transitory computer readable medium.

3. The system as recited in claim 1, wherein analyzing a step from the plurality of steps further includes:
   operating the chamber with parameters defined in the step;
   obtaining an instability measurement at the nominal frequency during the operating; and
   determining if the step produces instability based on the instability measurement.

4. The system as recited in claim 1, wherein the system controller is configured, for each testing frequency from the plurality of testing frequencies, to define a learning phase for setting capacitor values of a matching network before operating the chamber at each testing frequency using a frequency tuning mode.

5. The system as recited in claim 4, wherein the instability measurement is proportional to a maximum minus a minimum of RF delivered powered divided by an average RF delivered power during the measurement period.

6. The system as recited in claim 1, wherein when adjusting the operating frequency for a step from the plurality of steps, the system controller determines which testing frequency produces a lowest instability measurement for the step, and sets the operating frequency for the step to be the determined testing frequency that produces a lowest instability measurement.

7. The system as recited in claim 1, wherein the range of frequencies includes frequencies between the nominal frequency minus 10 percent and the nominal frequency plus 10 percent.

8. The system as recited in claim 7, wherein the range of frequencies includes frequencies between the nominal frequency minus 5 percent and the nominal frequency plus 5 percent.

9. The system as recited in claim 1, wherein, when constructing the second recipe, the system controller alters the first recipe by changing in the first recipe the operating frequency for a first step from the one or more steps producing instability at the nominal frequency with a different operating frequency, the different operating frequency producing a lower level of instability for the first step than the instability for the first step at the nominal frequency.

10. The system as recited in claim 1, wherein, when analyzing each step, the system controller measures instability of reflected power in the chamber.

11. The system as recited in claim 10, wherein, when analyzing each step, the system controller further measures instability of pressure in the chamber.

12. The system as recited in claim 1, wherein each step includes one or more phases, the phases including:
   a preparation phase;
   an ignition phase;
   a learn phase to set values of capacitors in a matching network; and
   a rapid alternating process phase operating in frequency tuning mode.

13. The system as recited in claim 12, wherein each step includes one or more parameters, the parameters including:
   a top RF power level;
   the operating frequency for the top RF power;
   a bottom RF power level;
   a bottom RF frequency;
   a gas mixture;
   a chamber pressure; and
   one or more time periods.

14. A system for processing a substrate, the system comprising:
   a chamber;
   an RF power supply for providing RF power to the chamber, the RF power supply being defined to operate in one operating frequency from a plurality of different oscillating frequencies; and
   a system controller is configured to access a first recipe having a plurality of steps using the operating frequency for the RF power supply equal to a nominal frequency, the system controller is further configured to access analysis of each of the plurality of steps of the first recipe where the operating frequency is equal to the nominal frequency, the analysis identified any step that produced instability that exceeded a threshold;
   the system controller is configured to execute a second recipe having a plurality of steps instead of the first recipe for etching one or more layers of material disposed over the substrate disposed in the chamber, the second recipe is configured to cause the system controller to adjust the operating frequency for at least one step of the second recipe to an adjusted frequency that is different from the nominal frequency, while other steps of the second recipe continue to use the nominal frequency;
   wherein during execution of the second recipe, the system controller is configured to control an oscillator of the RF power supply to change between the nominal frequency and the adjusted frequency.

15. The system as recited in claim 14, wherein each step includes one or more phases, the phases including:
   a preparation phase;
   an ignition phase;
   a learn phase to set values of capacitors in a matching network that supplies the RF power supply; and
   a rapid alternating process phase operating in frequency tuning mode.

16. The system as recited in claim 15, wherein the step that produced instability that exceed the threshold is identified for use of the adjusted frequency and processing using the adjusted frequency each of the preparation phase, the ignition phase, the learn phase and the rapid alternating process phase.

17. The system as recited in claim 14, wherein steps before a step that produced instability that exceed the threshold are set to operate at the nominal frequency by the system controller.

18. The system as recited in claim 14, wherein the analysis used to identify a step that produces instability and exceeded the threshold uses a plurality of testing frequencies within a range of frequencies, and obtaining a measurement of instability for each testing frequency.

19. The system as recited in claim 18, wherein the range of frequencies includes frequencies between the nominal frequency minus 10 percent and the nominal frequency plus 10 percent.

20. The system as recited in claim 18, wherein the range of frequencies includes frequencies between the nominal frequency minus 5 percent and the nominal frequency plus 5 percent.

* * * * *